(12) United States Patent
Otake

(10) Patent No.: US 11,239,809 B2
(45) Date of Patent: Feb. 1, 2022

(54) HIGH-FREQUENCY POWER AMPLIFIER APPARATUS

(71) Applicant: RIKEN, Saitama (JP)

(72) Inventor: Yuji Otake, Saitama (JP)

(73) Assignee: RIKEN, Saitama (JP)

( * ) Notice: Subject to any disclaimer, the term of this patent is extended or adjusted under 35 U.S.C. 154(b) by 47 days.

(21) Appl. No.: 16/606,101

(22) PCT Filed: Mar. 28, 2018

(86) PCT No.: PCT/JP2018/012815
§ 371 (c)(1),
(2) Date: Oct. 17, 2019

(87) PCT Pub. No.: WO2018/193804
PCT Pub. Date: Oct. 25, 2018

(65) Prior Publication Data
US 2021/0099143 A1    Apr. 1, 2021

(30) Foreign Application Priority Data
Apr. 17, 2017  (JP) .............................. JP2017-081186

(51) Int. Cl.
*H03F 1/07* (2006.01)
*H03F 3/60* (2006.01)
(Continued)

(52) U.S. Cl.
CPC ............. *H03F 3/604* (2013.01); *H03F 3/195* (2013.01); *H03F 3/245* (2013.01)

(58) Field of Classification Search
CPC ...................................... H03F 1/07; H03F 1/02
(Continued)

(56) References Cited

U.S. PATENT DOCUMENTS

| 4,647,869 A | 3/1987 | Kaneko et al. |
| 7,075,378 B2 * | 7/2006 | Howe .................. H03B 5/1817 |
| | | 331/107 DP |

(Continued)

FOREIGN PATENT DOCUMENTS

| JP | S61-121506 A | 6/1986 |
| JP | 2003-243948 A | 8/2003 |

(Continued)

OTHER PUBLICATIONS

International Search Report issued in corresponding International Application No. PCT/JP2018/012815 dated Jun. 19, 2018 (3 pages).
(Continued)

*Primary Examiner* — Henry Choe
(74) *Attorney, Agent, or Firm* — Osha Bergman Watanabe & Burton LLP

(57) ABSTRACT

A high-frequency power amplifier apparatus includes: a plurality of amplifiers that respectively amplify a plurality of distributed signals obtained by distributing a high-frequency signal of a predetermined frequency, the amplifiers respectively outputting a plurality of amplified signals; and a cavity-type high-frequency power combiner having a cavity surrounded by a conductor wall, the cavity-type high-frequency power combiner combining together power of the plurality of amplified signals in the cavity by operating in a $TE_{011}$ resonance mode with a resonance frequency equal to the predetermined frequency.

2 Claims, 15 Drawing Sheets

(51) Int. Cl.
*H03F 3/195* (2006.01)
*H03F 3/24* (2006.01)

(58) Field of Classification Search
USPC .............................................. 330/124 R, 295
See application file for complete search history.

(56) References Cited

U.S. PATENT DOCUMENTS 7,202,735 B2* 4/2007 Ichitsubo ............... H03F 1/0261
330/124 R
2009/0233644 A1* 9/2009 McCune, Jr. ....... H04L 27/2601
455/561

FOREIGN PATENT DOCUMENTS

JP 2006-275614 A 10/2006
JP 2011-185748 A 9/2011

OTHER PUBLICATIONS

Yuji Otake et al., "Cavity Combiner for S-Band Solid-State Amplifier for The High-Power Klystron at SLAC"; SLAC-PUB-5197; Mar. 1990 (22 pages).
Kazutaka Harumatsu et al., "Development of 509 MHz Solid State Amplifier with a Cavity-Type Power Combiner"; Proceedings of the 13th Annual Meeting of Particle Accelerator Society of Japan; pp. 421-424; Chiba, Japan; Aug. 8-10, 2016 (4 pages).
Akira Okubo et al., "The Analysis of the Coupling Field on a Double Cylindrical Cavity Structure"; The Bulletin of the Faculty of Engineering, Fukuyama University, vol. 17, No. 2, pp. 39-44; Dec. 1993 (7 pages).
F. Pérez et al., "High-Power Cavity Combiner for RF Amplifier"; Proceedings of EPAC 2006, THPCH179; pp. 3215-3217; Edinburgh, Scotland; 2006 (3 pages).
M. Langlois et al., "Resonant High Power Combiner"; Proceedings of 2005 Particle Accelerator Conference; pp. 3970-3972; Knoxville, Tennessee; 2005 (3 pages).
Mehdi Ghanadi, "A New Compact Broadband Radial Power Combiner"; Elektrotechnik und Informatik der Technischen Universität Berlin; Nov. 30, 2011 (116 pages).
Akhilesh Jain et al., "High-Power, Low-Loss, Radial RF Power Divider/Combiner"; WEPMA143; APAC 2007, Raja Ramanna Centre for Advanced Technology (RRCAT); pp. 520-522; Indore, India; 2007 (3 pages).

* cited by examiner

⟶ ELECTRIC FIELD
------⟶ MAGNETIC FIELD

⟶ ELECTRIC FIELD
------⟶ MAGNETIC FIELD

PULSE OUTPUT OPERATION

FIG.22
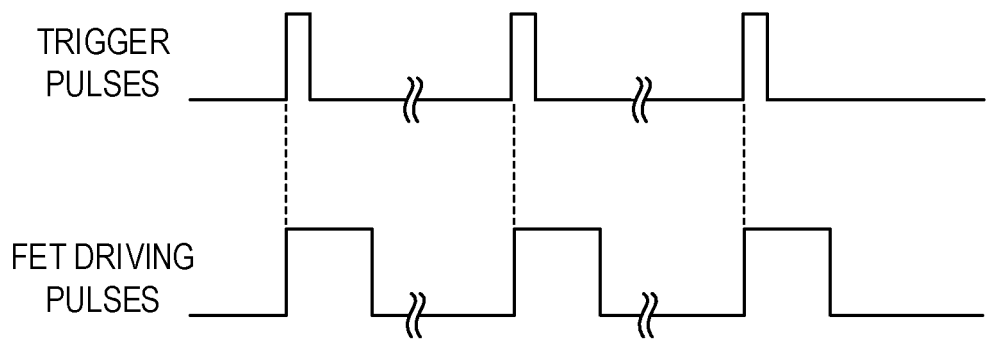
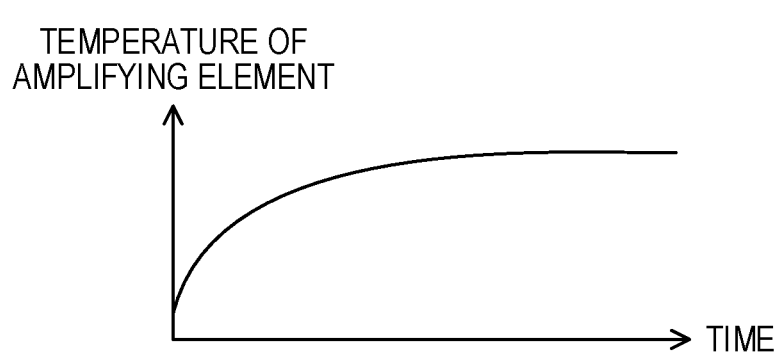
FIG.23A
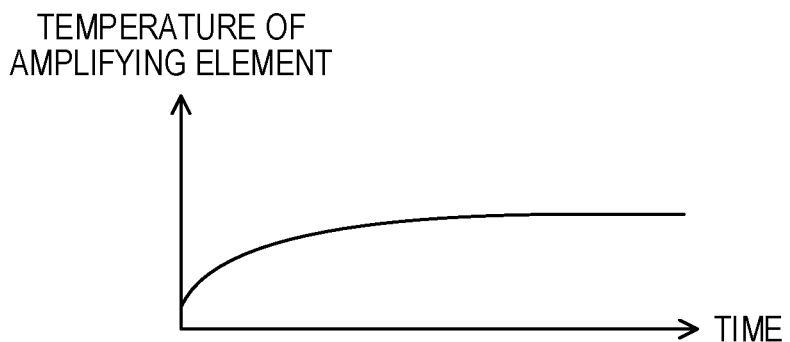
FIG.23B

HIGH-FREQUENCY POWER AMPLIFIER APPARATUS

TECHNICAL FIELD

The present invention relates to a high-frequency power amplifier apparatus.

BACKGROUND ART

In high-frequency power amplifier apparatuses for generating a continuous or pulse wave of several hundred watts to several hundred kilowatts, high-frequency semiconductor devices for power amplification, such as field-effect transistors, are used. The output power of a single high-frequency semiconductor device of such a type is limited. The upper limit of the output power is, though depending on the frequency of the high-frequency signal to be amplified, about 1 kW at, for example, 500 MHz with the current technology, and is lower at higher frequencies.

For higher-power high-frequency outputs, a technique of parallel-combining high-frequency semiconductor devices for power amplification (see Non-Patent Document 2 identified below) has been proposed. In this technique, one hundred 1 kW-output high-frequency semiconductor devices are used. High-frequency power from a single preamplifier is, by a distributor, distributed among and fed to those high-frequency semiconductor devices, and the outputs from these are parallel-combined to obtain a high-frequency output of the order of 100 kW.

As a power combiner for power combining, cavity-type high-frequency power combiners (see Non-Patent Documents 1-5) and radial high-frequency power combiners (see Non-Patent Documents 6 and 7) have been proposed.

LIST OF CITATIONS

Non-Patent Literature

Non-Patent Document 1: Yuji Otake et al., "Cavity Combiner for S-band Solid-state Amplifier for The High-power Klystron at SLAC", SLAC-PUB-5197, 1990
Non-Patent Document 2: K. Harumatsu et al., "Development of 509 MHz Solid State Amplifier with a Cavity-Type Power Combiner", Proceedings of the 13th Annual Meeting of Particle Accelerator Society of Japan (PASJ2016), MOP034, 2016
Non-Patent Document 3: A. Okubo et al., "The Analysis of the Coupling Field on a Double Cylindrical Cavity Structure", The Bulletin of the Faculty of Engineering, Fukuyama University, 1993, Vol. 17, No. 2, pp. 39-44
Non-Patent Document 4: F. Perez et al., "High-Power Cavity Combiner for RF Amplifier", Proceedings of EPAC 2006, 2006, THPCH179, pp. 3215-3217
Non-Patent Document 5: M. Langlois et al., "Resonant High Power Combiner", Proceedings of 2005 Particle Accelerator Conference, 2005, pp. 3970-3972
Non-Patent Document 6: M. Ghanadi, "A New Compact Broadband Radial Power Combiner", Elektrotechnik and Informatik der Technischen Universitat Berlin, 2011
Non-Patent Document 7: A. Jain et al., "High-power, Low-loss, Radial RF power Divider/Combiner", APAC 2007, 2007, WEPMA143, pp. 520-522

SUMMARY OF THE INVENTION

Technical Problem

Needless to say, in high-frequency power amplifier apparatuses, reducing loss is of great importance. In particular in cases where a high power output is desired, even a slight difference in the proportion of loss to output causes a great difference in the effect of the loss. For example, for an output of 100 kW, a change of 1% in the proportion causes a variation of 1 kW in the loss, Against the background discussed above, an object of the present invention is to provide a high-frequency power amplifier apparatus that contributes to reduction of loss.

Means for Solving the Problem

According to one aspect of the present invention, a high-frequency power amplifier apparatus includes: a plurality of amplifiers that respectively amplify a plurality of distributed signals obtained by distributing a high-frequency signal of a predetermined frequency, the amplifiers respectively outputting a plurality of amplified signals; and a cavity-type high-frequency power combiner having a cavity surrounded by a conductor wall, the cavity-type high-frequency power combiner combining together the power of the plurality of amplified signals in the cavity by operating in the $TE_{011}$ resonance mode with a resonance frequency equal to the predetermined frequency.

Advantageous Effects of the Invention

According to the present invention, it is possible to provide a high-frequency power amplifier apparatus that contributes to reduction of loss.

BRIEF DESCRIPTION OF DRAWINGS

FIG. 22 is a diagram showing trigger pulses and FET driving pulses in connection with the postamplifier in FIG. 21; and FIGS. 23A and 23B are diagrams showing variation of the temperature of an amplifier element with a direct-current driving method and with a pulse driving method respectively.

DESCRIPTION OF EMBODIMENTS

Hereinafter, examples embodying the present invention will be described specifically with reference to the accompanying drawings. Among the diagrams referred to, the same parts are identified by the same reference signs, and in principle no overlapping description of the same parts will be repeated. In the present description, to simplify description, symbols and other designations referring to information, signals, physical quantities, components, and the like are occasionally used with the names of the corresponding information, signals, physical quantities, components, and the like omitted or abbreviated.

Figure 1:
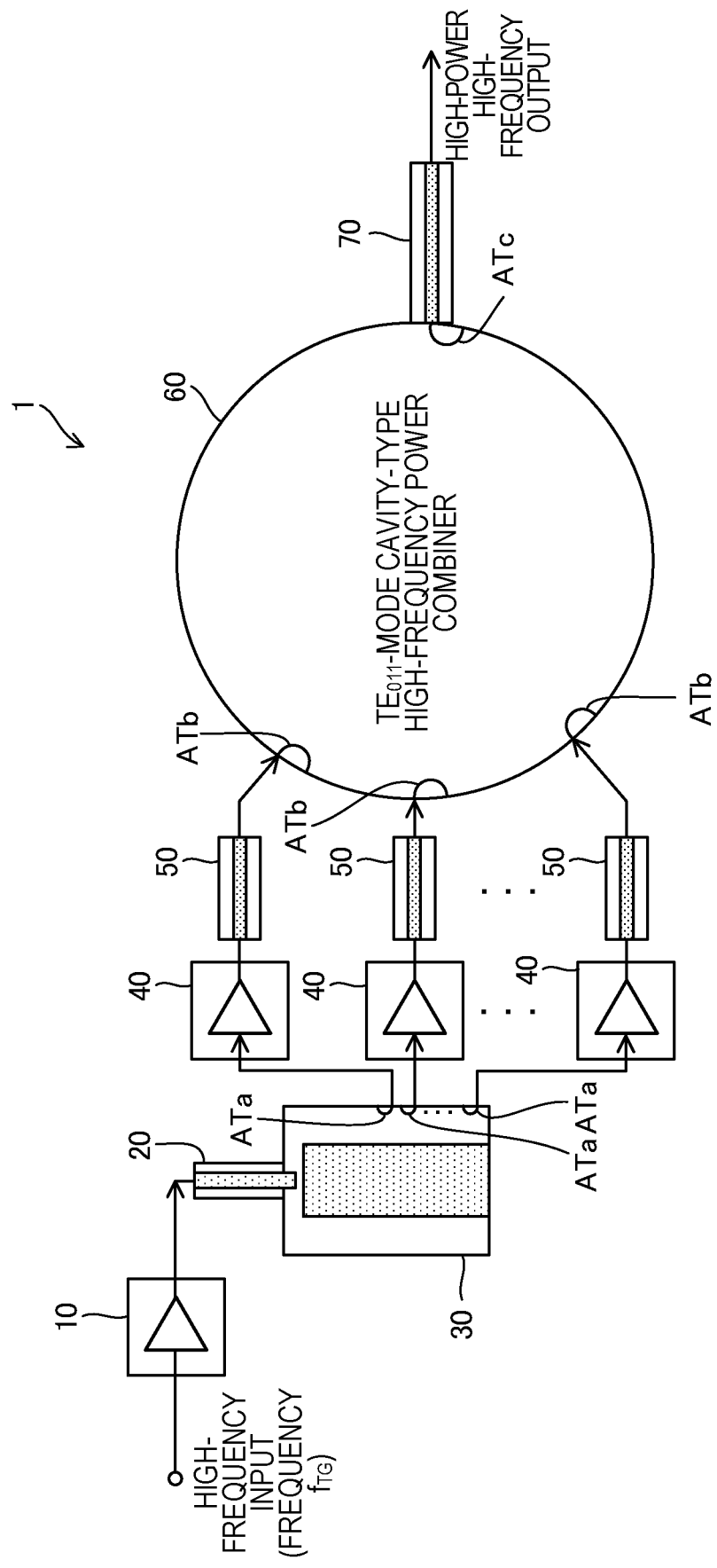
FIG. 1 is a schematic block diagram of a high-frequency power amplifier apparatus according to one embodiment of the present invention.

FIG. 1 is a schematic block diagram of a high-frequency power amplifier apparatus 1 according to one embodiment of the present invention. The high-frequency power amplifier apparatus 1 includes a preamplifier 10, an electric-field coaxial coupler 20, a power distributor (reentrant cavity-type high-frequency power distributor) 30, postamplifiers 40, coaxial lines 50, a power combiner ($TE_{011}$-mode cavity-type high-frequency power combiner) 60, and an output coaxial waveguide 70. The high-frequency power amplifier apparatus 1 further includes, as elements constituting it, loop antennas ATa, ATb, and ATc, which will be described later. It should be noted that, while loop antennas are shown in FIG. 1 and several other diagrams, there they are shown schematically or conceptually; that is, their shapes are not represented accurately. In practice, loop antennas can be given such shapes as to achieve their respective functions.

In this embodiment, the high frequency dealt with by the high-frequency power amplifier apparatus 1 is, for example, a frequency in a band from 100 MHz (megahertz) to 10 GHz (gigahertz), both ends inclusive. However, any frequency outside that band (for example a frequency from several tens of megahertz to several tens of gigahertz) may be understood to belong to high frequencies.

The preamplifier 10 is fed with a high-frequency input signal of a predetermined frequency $f_{TG}$, amplifies it, and then outputs the result. The preamplifier 10 functions as a power amplifier, and thus compared with the power (input power) of the input signal to the preamplifier 10, the power (output power) of the output signal from the preamplifier 10 is higher. The preamplifier 10 achieves power amplification by using, for example, a GaN (gallium nitride)-HEMT (high electron mobility transistor). However, power amplification may be achieved by use of any other type of transistor than a GaN-HEMT. The preamplifier 10 can perform, for example, class-A or class-AB amplification. The frequency $f_{TG}$ can be any frequency that belongs to high frequencies (radio frequencies), and is, for example, a frequency of 476 MHz. It is here assumed that the power of the output signal from the preamplifier 10 is 20 W, but the power is not limited to 20 W.

The output signal from the preamplifier 10 is fed to the electric-field coaxial coupler 20, which is a coaxial line, so as to be propagated via the electric-field coaxial coupler 20 to the power distributor 30.

Figure 2A:
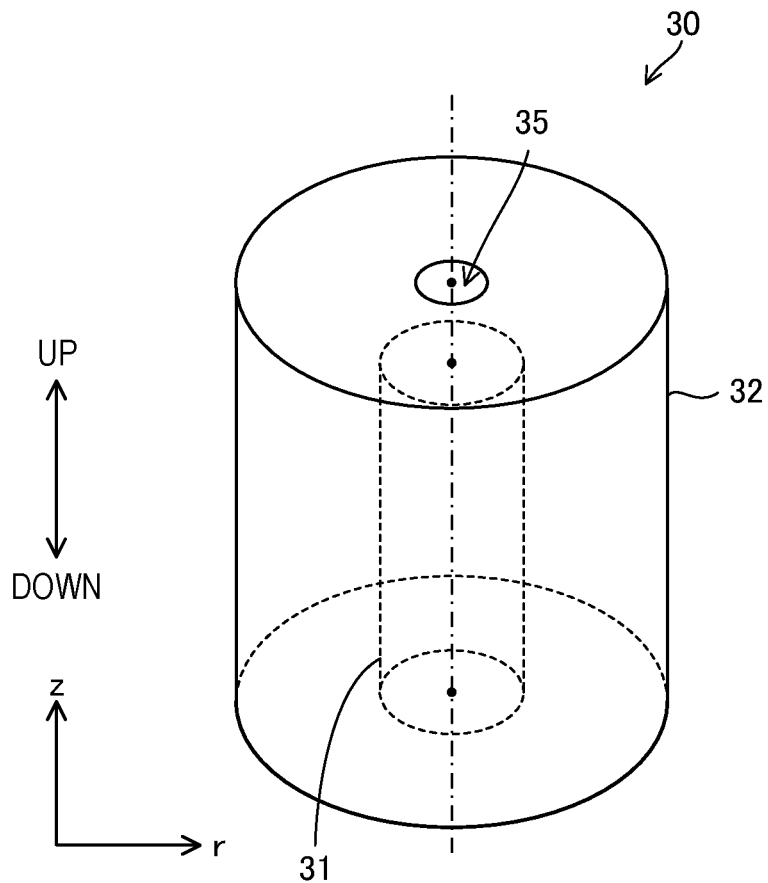
FIGS. 2A and 2B are a perspective view and a top view, respectively, of a power distributor according to the embodiment of the present invention.
Figure 2B:
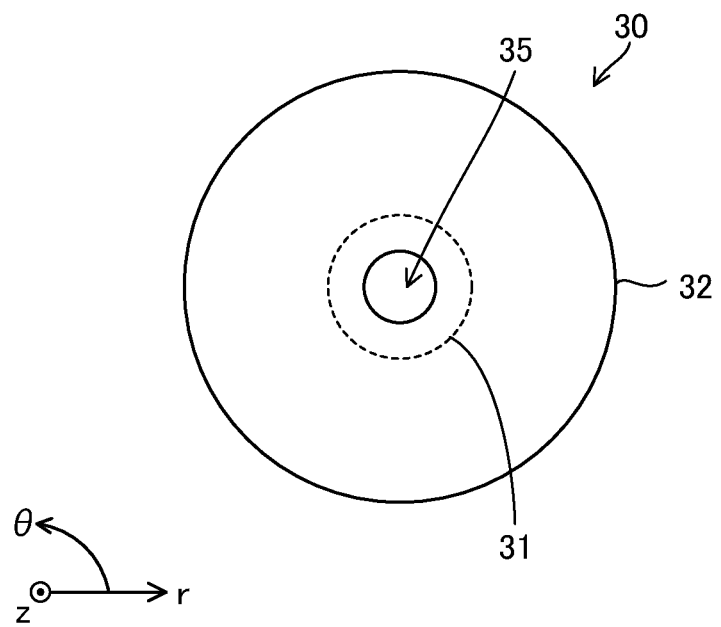
Figure 3:
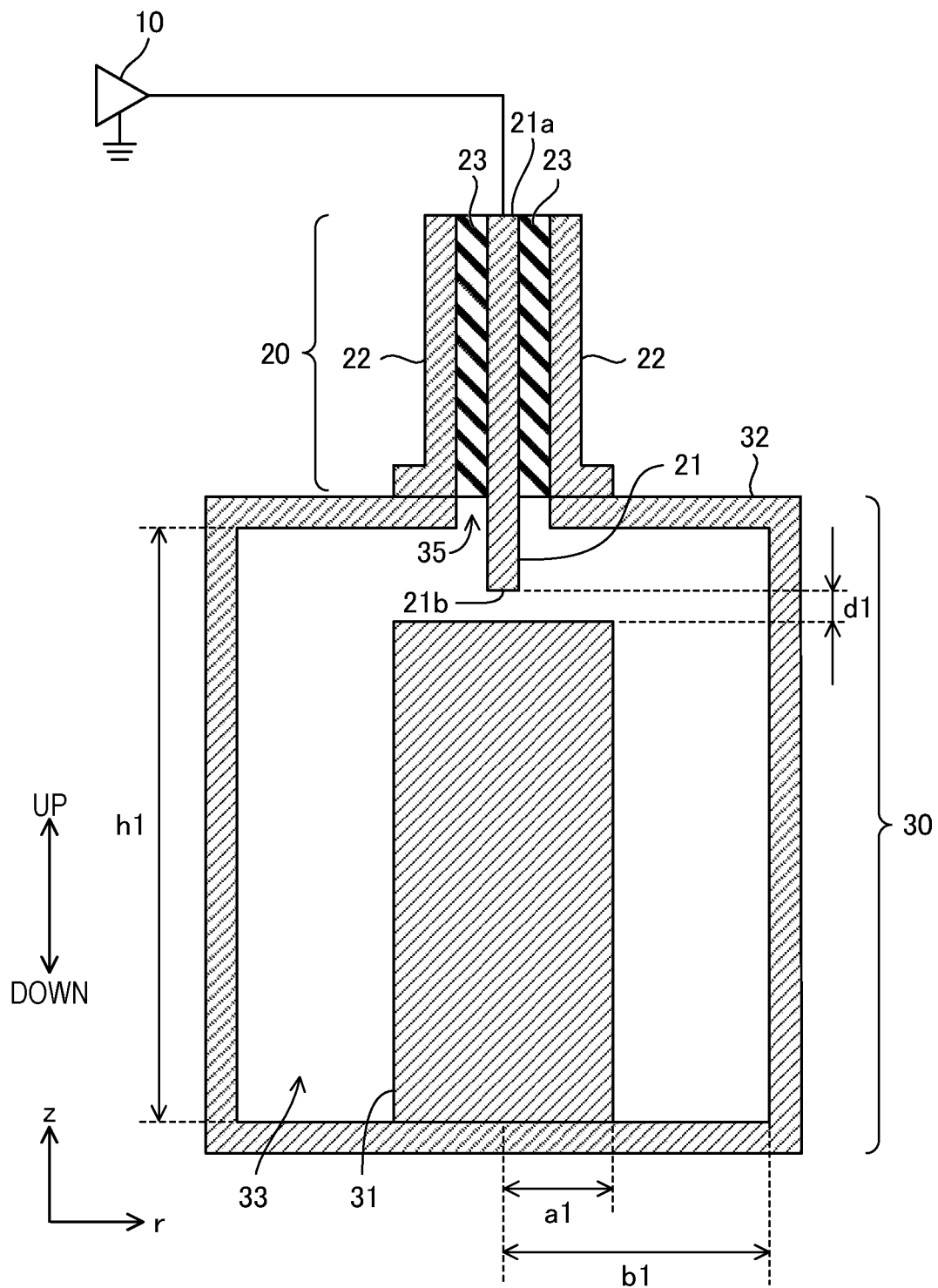
FIG. 3 is a sectional view of an electric-field coaxial combiner and the power distributor according to the embodiment of the present invention.

With references to FIGS. 2A, 2B, and 3, a description will be given of the coupling of the preamplifier 10, the electric-field coaxial coupler 20, and the power distributor 30 with each other as well as the configuration and other features of the power distributor 30. FIG. 2A is a schematic perspective view of the power distributor 30. FIG. 2B is a top view of the power distributor 30. FIG. 3 is a sectional view (along the z-axis, which will be mentioned later) of the electric-field coaxial coupler 20 and the power distributor 30. The power distributor 30 serves to distribute and transmit the output power from the preamplifier 10 among and to the plurality of postamplifiers 40 by magnetic field coupling, and accordingly, as will be described later, loop antennas ATa (see FIG. 1) for magnetic field coupling are inserted in the power distributor 30. To avoid complicated illustration, however, in FIGS. 2A, 2B, and 3, the loop antennas ATa are omitted from illustration.

The power distributor 30 is configured as a reentrant cavity-type high-frequency power distributor. More specifically, the power distributor 30 includes an outer conductor 32 in a cylindrical shape and a bar-form inner conductor 31 arranged inside the cylinder defined by the outer conductor 32. Also at the top and bottom faces of the cylinder defined by the outer conductor 32, the conductor forming the outer conductor 32 is present. Thus, the outer conductor 32 can be said to have the shape of a hollow circular column. The inner conductor 31 and the outer conductor 32 are both formed of a conductor such as metal. In the power distributor 30, the cavity in a cylindrical shape that is formed inside the outer conductor 32 is identified by the reference sign "33". Here, it should be noted that the cylinder defined by the cavity 33 has a top face. Thus, in the sectional view in FIG. 3, the cavity 33 has a U-shape. In FIGS. 2A and 2B, to simplify illustration, the wall thickness of the outer conductor 32 is ignored.

The inner conductor 31 is arranged inside the space surrounded by the outer conductor 32. The inner conductor 31 is a conductor having a circular columnar shape. The axis of the cylinder defined by the outer conductor 32, the axis of the circular column defined by the inner conductor 31, and the axis of the cylinder defined by the cavity 33 align with each other. FIG. 3 shows a section of the electric-field coaxial coupler 20 and the power distributor 30 across a plane that passes through and is parallel to those axes.

Now, a cylindrical coordinate system using z, r, and θ will be introduced. In the cylindrical coordinate system, the z-axis direction corresponds to the axial direction of a cylinder or circular column, the r direction corresponds to the radial direction with respect to the cylinder or circular column (that is, the direction perpendicular to the z-axis), and the θ direction corresponds to the circumferential direction (orbital direction) with respect to the cylinder or circular column. It is assumed that the z-axis direction is parallel to the up-down direction; that the positive direction along the z-axis corresponds to the upward direction and the negative direction along the z-axis corresponds to the downward direction; and that the direction pointing from top to bottom coincides with the direction in which gravity acts.

If, for the sake of discussion, the bottom face of the inner conductor 31 and the bottom face of the outer conductor 32 are joined together by a conductor and in addition the top face of the inner conductor 31 and the top face of the outer conductor 32 are joined together with a conductor, the inner and outer conductors 31 and 32 together form a coaxial cavity. In practice, in the power distributor 30, the bottom face of the inner conductor 31 and the bottom face of the outer conductor 32 are joined together by a conductor, but the top face of the inner conductor 31 and the top face of the outer conductor 32 are not joined together with a conductor, and instead a gap is left between the top face of the inner conductor 31 and the top face of the outer conductor 32 (the gap is part of the cavity 33). Thus, the power distributor 30 forms a reentrant cavity.

In the power distributor 30, of the space surrounded by the outer conductor 32, the part where the inner conductor 31 is not present is the cavity 33 constituting the reentrant cavity. Put otherwise, the power distributor 30 includes a hollow outer conductor 32 that has a cavity 33 formed inside it and an inner conductor 31 that is arranged inside the cavity 33.

In a central part of the top face of the outer conductor 32, an opening 35 is formed, which is a circular hole. The electric-field coaxial coupler 20 is a coaxial line composed of a core lead 21 as an inner conductor, an outer conductor 22 laid around the core lead 21 so as to surround it, and an insulator 23 arranged between the core lead 21 and the outer conductor 22. The outer conductor 22 is connected to a reference potential point at zero volts, and is joined, around the opening 35, to the outer conductor 32 of the power distributor 30. The core lead 21 is a metal lead in a circular columnar shape, and receives, at one end 21a of the core lead 21, the output signal from the preamplifier 10. Part of the core lead 21 is inserted in the cavity 33 via the opening 35, and the other end, that is, the bottom end 21b, of the core lead 21 is located opposite the inner conductor 31 across a distance dl. The axis of the circular column defined by the core lead 21 and the axis of the circular column defined by the inner conductor 31 coincide with each other.

Thus, part of the core lead 21 of the coaxial line (20) across which the high-frequency signal, which is the output signal from the preamplifier 10, is propagated is inserted in the cavity 33 via the opening 35 provided in the outer conductor 32 and, while the top face of the inner conductor 31, that is, one end face of the inner conductor 31, is located opposite the bottom end 21b of the core lead 21, the other end face of the inner conductor 31, that is, the bottom face of the inner conductor 31, is short-circuited to the outer conductor 32 by being directly joined to it.

Consequently, the bottom end 21b of the core lead 21 and the top face of the inner conductor 31, which are located opposite each other, achieve electric field coupling to form a capacitor. Thus, the electromagnetic wave due to the high-frequency signal output from the preamplifier 10 is, by electric field coupling due to the capacitor, introduced into and radiated across the cavity 33. The electric-field coaxial coupler 20 functions as a coaxial line for achieving electric field coupling of the output from the preamplifier 10 with the cavity 33.

In the present description, it is assumed that, for any member in a cylindrical or circular columnar shape, its axis, diameter, radius, and height refer to the axis, diameter, radius, and height of the cylinder or circular column defined by that member, and that the same applies equally to any other terms (orbit, circumference, etc.) describing such a cylinder or circular column. For example, the axis, diameter, radius, and height of the inner conductor 31 refer to the axis, diameter, radius, and height of the circular column defined by the inner conductor 31.

The same is true with cavities. Specifically, it is assumed that, for any cavity in a cylindrical or circular columnar shape, its axis, diameter, radius, and height refer to the axis, diameter, radius, and height of the cylinder or circular column defined by that cavity, and that the same applies equally to any other terms (orbit, circumference, etc.) describing such a cylinder or circular column. For example, the axis, diameter, radius, and height of the cavity 33 refer to the axis, diameter, radius, and height of the circular column defined by the cavity 33.

More specifically, for the cavity 33, first suppose a cavity in a circular columnar shape with a radius b1 and a height h1 and then remove, from that cavity in the circular columnar shape, the part of it which is occupied by the inner conductor 31 and the core lead 21; then the space left is the cavity 33. The radius of the inner conductor 31 is represented by a1.

Figure 4:
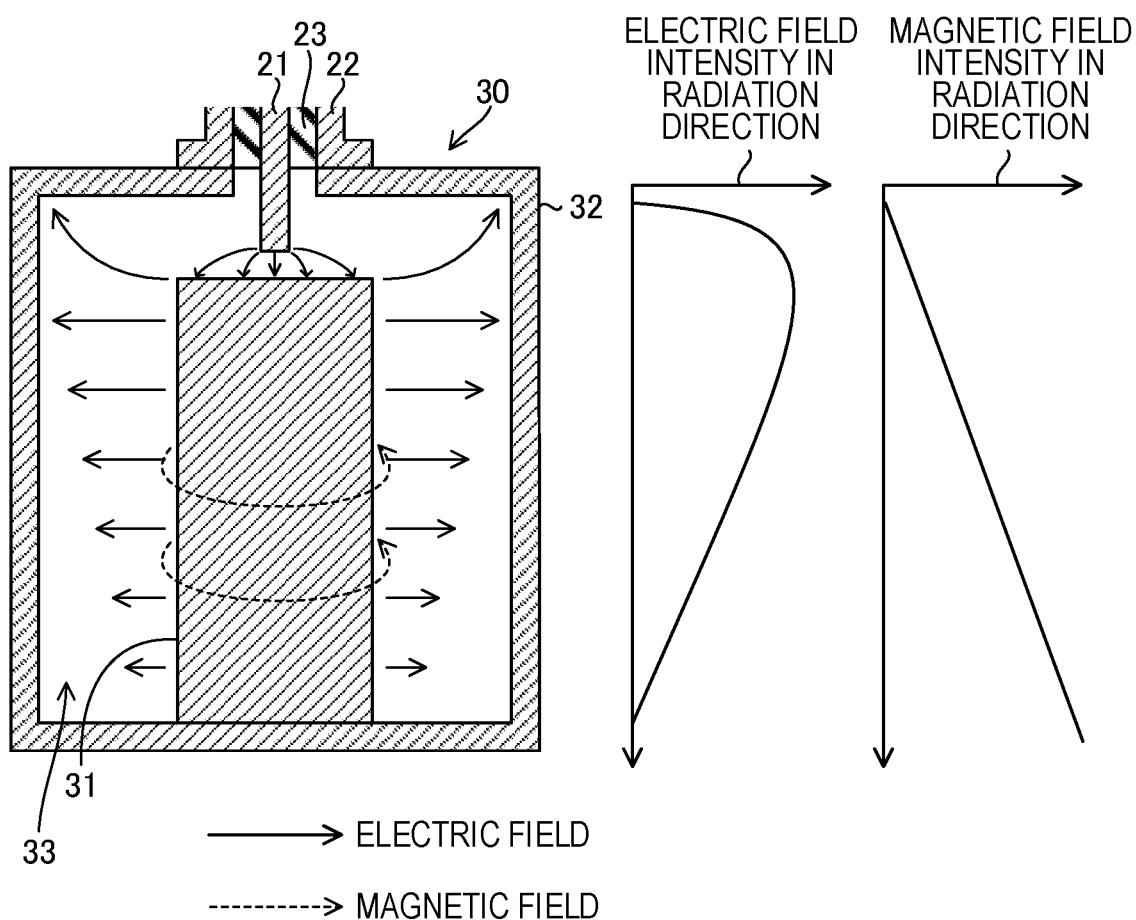
FIG. 4 is a diagram showing an electromagnetic field distribution in a cavity inside the power distributor according to the embodiment of the present invention.

FIG. 4 shows, in a simplified illustration, the electromagnetic field induced inside the cavity 33. Shown together in FIG. 4 schematically is the z-axis position dependence of the electric field strength and the magnetic field strength in the radiation direction inside the cavity 33 (the direction perpendicular to the axis of the cavity 33). In FIG. 4, arrowed solid lines indicate the electric field inside the cavity 33, and arrowed broken lines indicate the magnetic field inside the cavity 33. The electromagnetic wave that is propagated inside the cavity 33 resembles a TEM (transverse electromagnetic) wave.

The power distributor 30 has a function as a cavity resonator with a resonance frequency $f_{TG}$. The shape of the power distributor 30 (that is, the values of a1, b1, and h1, the height of the inner conductor 31, etc.), as well as the distance dl between the bottom end 21b of the core lead 21 of the electric-field coaxial coupler 20 and the top face of the inner conductor 31, is determined such that a high-frequency signal of a frequency $f_{TG}$ resonates inside the cavity 33 (that is, an electromagnetic field of a frequency $f_{TG}$ produces a resonance phenomenon inside the cavity 33).

For a high-frequency signal of a frequency $f_{TG}$ to resonate in a coaxial cavity, the height of the coaxial cavity needs to be set at a height "λg/2", where λg represents the wavelength of the electromagnetic wave of a frequency $f_{TG}$ inside the cavity. In contrast, for a high-frequency signal of a frequency $f_{TG}$ to resonate in a reentrant cavity, the height of the reentrant cavity can be set at a height larger than but close to "λg/4", that is, a height at least smaller than "λg/2". This is self-evident from the characteristics of a reentrant cavity. Thus, in the power distributor 30, which is of a reentrant cavity type, the cavity 33 can be set at a height larger than but close to "λg/4", that is, a height at least smaller than "λg/2".

Figure 5:
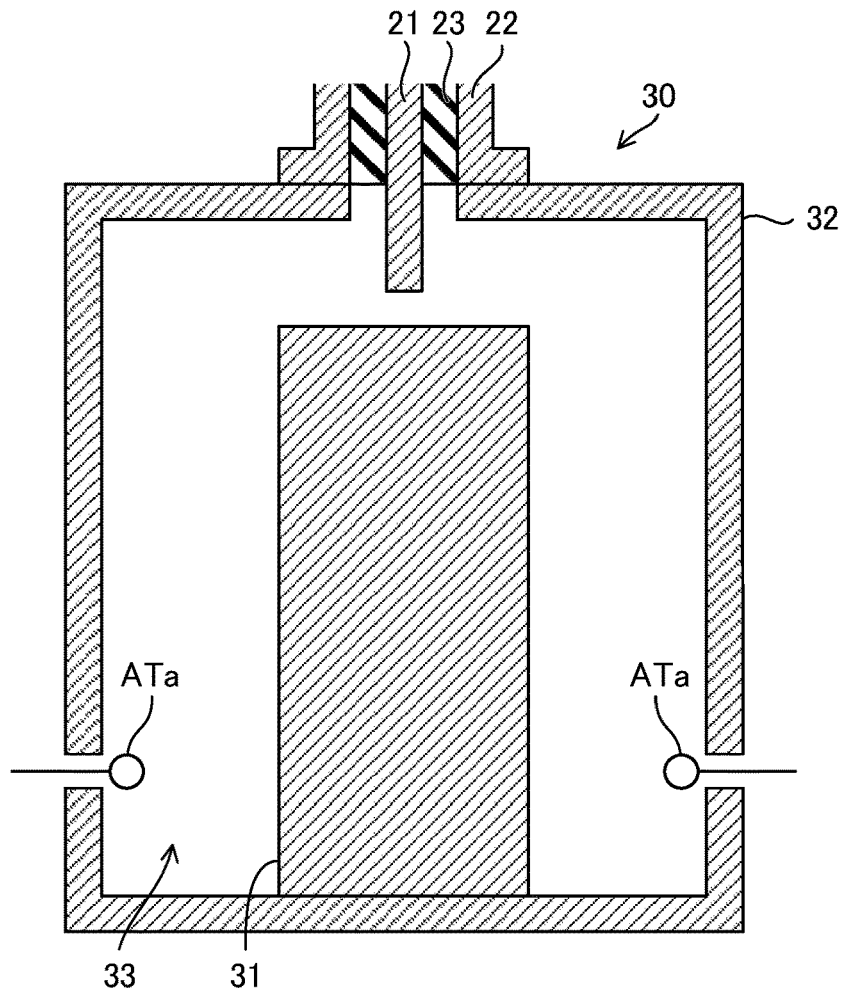
FIG. 5 is a diagram showing a plurality of loop antennas inserted in the cavity inside the power distributor according to the embodiment of the present invention.

As shown in FIG. 5, in practice, a plurality of loop antennas ATa are inserted in the cavity 33. In the power distributor 30 of a reentrant cavity type, the magnetic field strength in the radiation direction tends to be higher in the bottom side, and accordingly the plurality of loop antennas are arranged in a dispersed manner with higher concentration in the bottom side than in the top side of the cavity 33.

Figure 6:
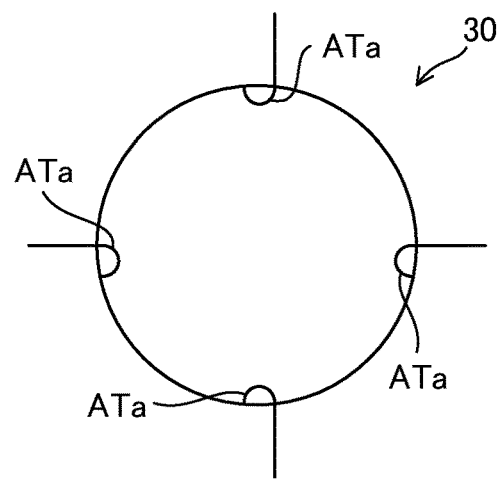
FIG. 6 is a diagram illustrating the arrangement positions of the plurality of loop antennas inserted in the cavity inside the power distributor according to the embodiment of the present invention.

As shown in FIG. 6, a plurality of loop antennas ATa are arranged in a dispersed manner along the cylindrical face of the outer conductor 32 of the power distributor 30. A transmission line (which can be any transmission line so long as it is an impedance-matched transmission line such as a coaxial line) extending from each of the loop antennas ATa is led out of the outer conductor 32 through its cylindrical face. While FIG. 6 shows a total of four loop antennas ATa inserted in the cavity 33, any number other than four of loop antennas ATa can be inserted in the cavity 33. The loop antennas ATa are connected to the postamplifiers 40 in one-to-one correspondence. The outer conductor 32 of the power distributor 30 has holes formed in it through which the transmission lines extending from the loop antennas ATa inside the cavity 33 are led out of the outer conductor 32. Through those holes, the transmission lines extending from the loop antennas ATa are connected to the input side of the postamplifiers 40.

The number of the postamplifiers 40 provided in the high-frequency power amplifier apparatus 1 is represented by N. N is any integer of two or more. The following description assumes that N=100 unless otherwise stated. That is, the loop antennas ATa and the postamplifiers 40 are provided in 100 pairs in total.

The magnetic field inside the cavity 33 links with the loop antennas ATa. Thus, the energy introduced from the preamplifier 10 via the electric-field coaxial coupler 20 into the cavity 33 and stored inside the cavity 33 is, by magnetic coupling, distributed to the 100 loop antennas ATa in all so as to be fed via the loop antennas ATa to the postamplifiers 40 respectively. When, as mentioned above, the power of the output signal from the preamplifier 10 is 20 W, then ideally (that is, if loss and uneven distribution are disregarded), a high-frequency signal of a frequency $f_{TG}$ with a power of 200 mW is fed to each the postamplifier 40 via the corresponding loop antenna ATa.

Each postamplifier 40 amplifies and then outputs the high-frequency signal of a frequency $f_{TG}$ that is fed to it via the loop antenna ATa. The postamplifier 40 functions as a power amplifier, and thus compared with the power (input power) of the input signal to the postamplifier 40, the power (output power) of the output signal from the postamplifier 40 is higher. The postamplifier 40 achieves power amplification by using, for example, an LDMOS (laterally diffused metal-oxide-semiconductor)-FET (field-effect transistor). However, power amplification may be achieved by use of any other type of transistor than an LDMOS-FET. Here, it is assumed that the power of the output signal from each postamplifier 40 is 1 kW (though not limited to 1 kW). Thus, the 100 postamplifiers 40 each output a high-frequency signal of a frequency $f_{TG}$ with a power of 1 kW. The postamplifiers 40 can perform, for example, class-A or class-AB amplification.

As one loop antenna ATa is provided for each postamplifier 40 on its input side, so for each postamplifier 40 on its output side one coaxial line 50 and one loop antenna ATb are provided. The output signal from each postamplifier 40 (in other words, the high-frequency power output from each postamplifier 40) is fed to the power combiner 60 via the corresponding coaxial line 50 and the corresponding loop antenna ATb. Instead of the coaxial lines 50, any other transmission lines such as strip lines may be used.

Figure 7:
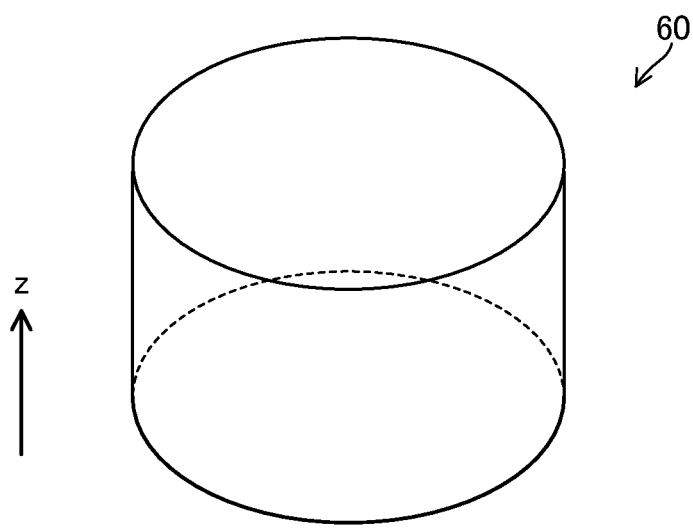
FIG. 7 is a perspective view of a power combiner according to the embodiment of the present invention.
Figure 8:
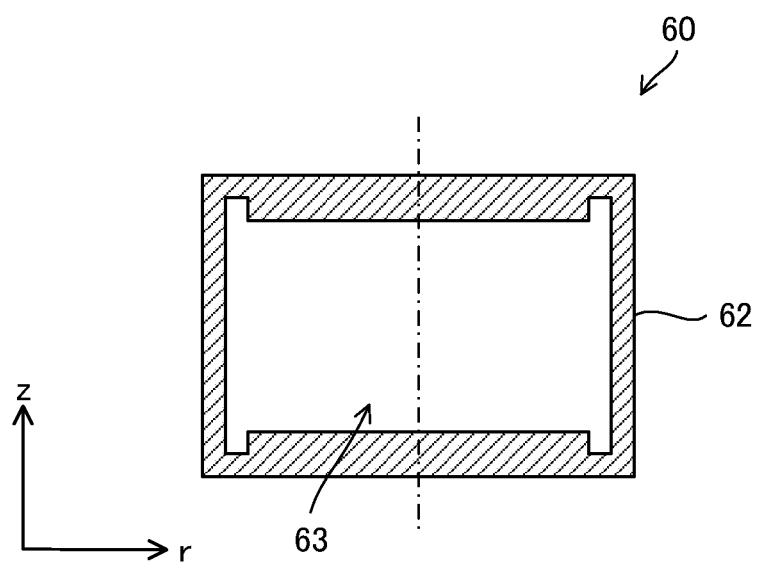
FIG. 8 is a sectional view of the power combiner according to the embodiment of the present invention.

The power combiner 60 is configured as a cavity-type high-frequency power combiner. FIG. 7 is a perspective view of the power combiner 60. FIG. 8 is a sectional view of the power combiner 60.

The power combiner 60 is formed of a metal casing 62 (conductor wall) having a cylindrical shape. Also at the top and bottom faces of the cylinder defined by the metal casing 62, the metal forming the metal casing 62 is present. Thus, the metal casing 62 can be said to have a hollow circular columnar shape. Here, it is assumed that the casing 62 is formed of metal and thus it is referred to as the metal casing 62; however, the material that forms the casing 62 may be a conductor that is not classified as a metal.

In the power combiner 60, the cavity formed inside the metal casing 62 is identified by the reference symbol "63". That is, the cavity 63 is a cavity surrounded by the conductor wall constituting the metal casing 62.

Figure 9:
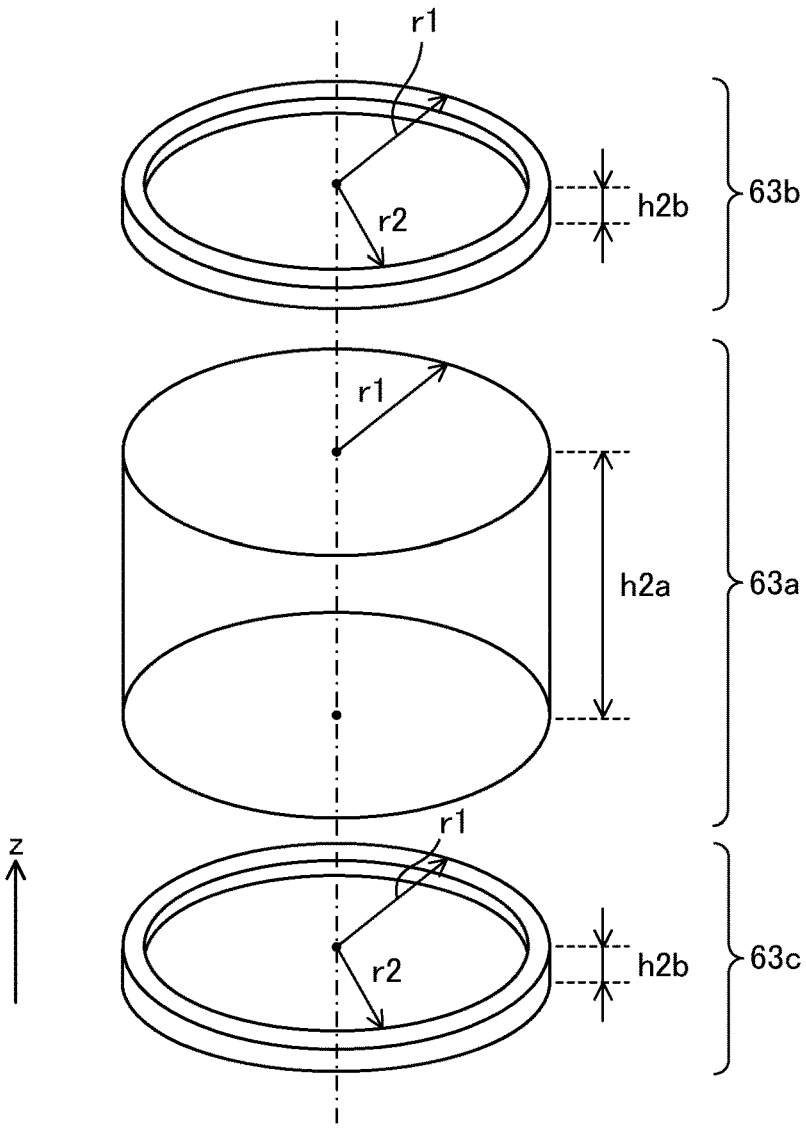
FIG. 9 is a diagram illustrating the shape of the cavity in the power combiner in FIG. 8.
Figure 10:
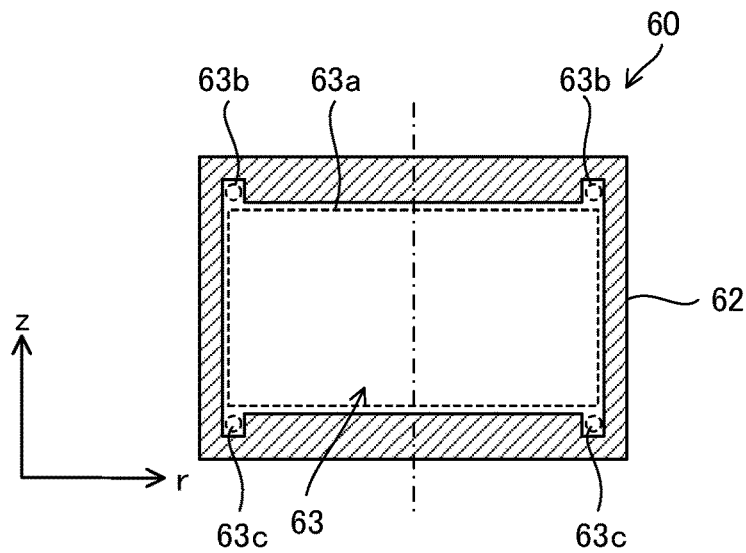
FIG. 10 is a sectional view of the power combiner according to the embodiment of the present invention.

With reference to FIG. 9, the shape of the cavity 63 will be described. In FIG. 9, the reference symbol "63a" identifies a circular column with a radius r1 and a height h2a, and the reference symbols "63b" and "63c" each identify a cylinder with a radius r1 and a height h2b and with a cylindrical face thickness (r1−r2). That is, the cylinders 63b and 63c are each a cylinder with an inner radius r2, an outer radius r1, and a height h2b (where r1>r2). The circular column 63a and the cylinders 63b and 63c are joined together such that, with the axes of the circular column 63a and the cylinders 63b and 63c aligned on a single straight line, the circular column 63a is located between the cylinders 63b and 63c. The shape of the object resulting from the joining corresponds to the shape of the cavity 63. That is, the cavity 63 has the shape of a circular columnar space (63a) having annular spaces (63b, 63c) added to it at its top and bottom faces respectively (see also FIG. 10).

Figure 11:
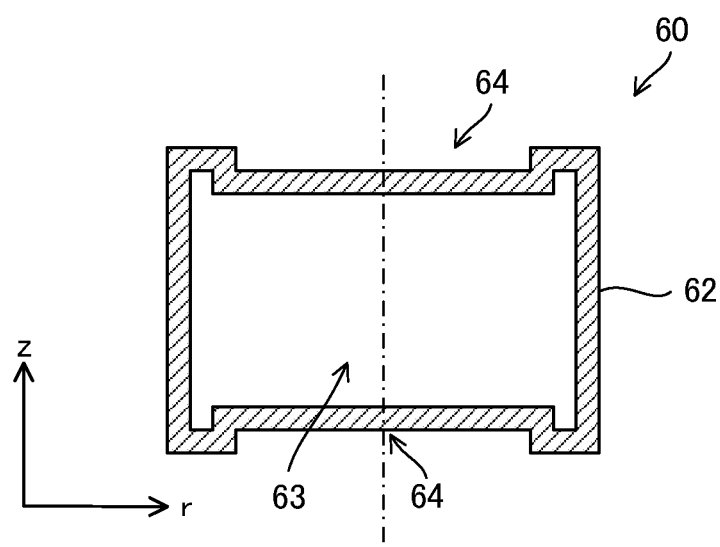
FIG. 11 is a sectional view of a modified version of the power combiner according to the embodiment of the present invention.

The axis of the metal casing 62 and the axis of the cavity 63 (that is, the axes of the spaces that define the circular column 63a and the cylinders 63b and 63c respectively) align on the same axis. FIG. 8 is a sectional view of the power combiner 60 across a sectional plane that passes through and is parallel to those axes. As shown in FIG. 11, in the top and bottom faces of the metal casing 62, recesses 64 may be provided to reduce the wall thickness of the top and bottom faces of the metal casing 62.

Figure 12:
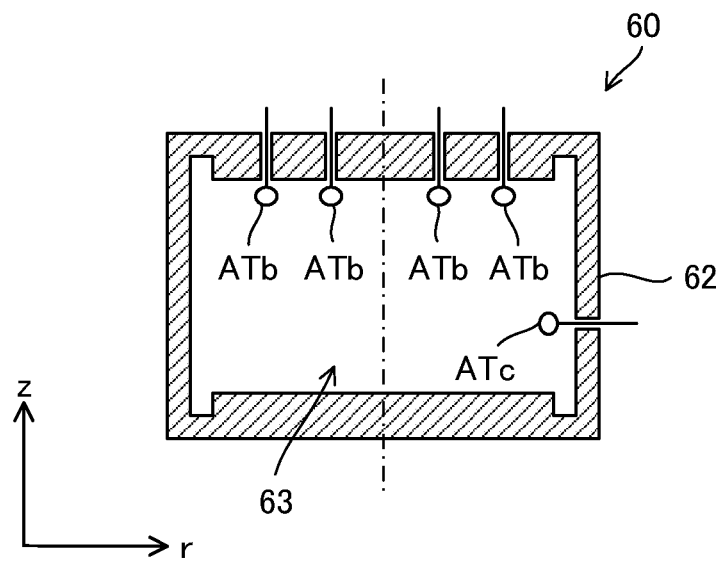
FIG. 12 is a diagram showing a plurality of loop antennas inserted in the cavity inside the power combiner according to the embodiment of the present invention.
Figure 13:
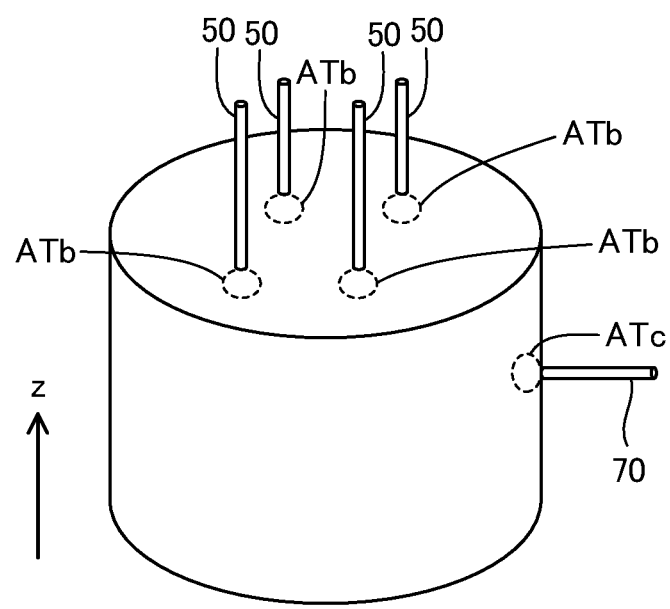
FIG. 13 is a perspective view of the power combiner and the components peripheral to it according to the embodiment of the present invention.

Although not shown in FIG. 8, in practice, as shown in FIG. 12, a plurality of loop antennas ATb as well as one loop antenna ATc are inserted in the cavity 63. With reference also to FIG. 13, the transmission lines of the output signals from the postamplifier 40 are, by use of the coaxial lines 50, led through the top face of the power combiner 60 into the cavity 63 to be connected to the loop antennas ATb. Accordingly, the electromagnetic wave due to the output signals from the postamplifiers 40 is radiated, via the corresponding coaxial lines 50, from the corresponding loop antennas ATb into the cavity 63. In FIGS. 12 and 13, to simplify illustration, only four each of the coaxial line 50 and the loop antennas ATb are shown; in practice, the coaxial lines 50 and the loop antennas ATb are provided in so many pairs as the number of the postamplifiers 40. The top face of the metal casing 62 of the power combiner 60 has holes formed in it through which the transmission lines extending from the loop antennas ATb inside the cavity 63 are led out of the metal casing 62. Through those holes, the transmission lines extending from the loop antennas ATb are connected to the output side of the postamplifiers 40.

The power combiner 60 has a function as a cavity resonator with a resonance frequency $f_{TG}$. The shape of the power combiner 60 (that is, the values of h2a, h2b, r1, r2, etc.) is determined such that a high-frequency signal of a frequency $f_{TG}$ resonates in the $TE_{011}$ mode inside the cavity 63 (that is, an electromagnetic field of a frequency $f_{TG}$ produces a resonance phenomenon in the $TE_{011}$ mode inside the cavity 63).

Figure 14A:
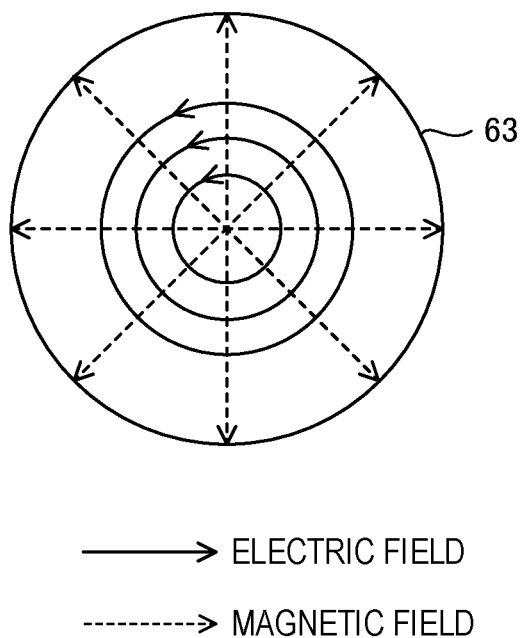
FIGS. 14A and 14B are diagrams showing an electromagnetic field distribution in the cavity inside the power combiner according to the embodiment of the present invention.
Figure 14B:
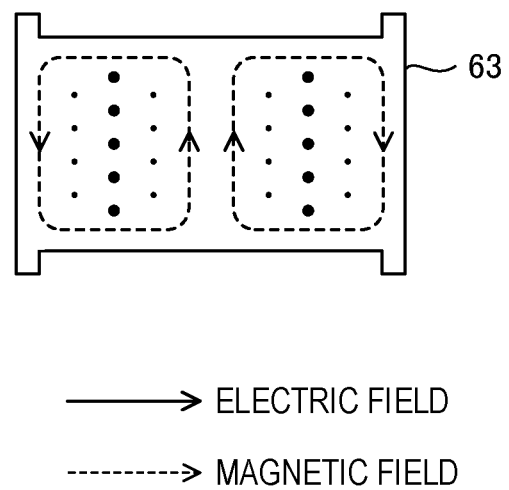

FIGS. 14A and 14B show, in a simplified illustration, an electromagnetic field resonating in the $TE_{011}$ mode inside the cavity 63. FIG. 14A shows the $TE_{011}$ mode electromagnetic field on a sectional plane that passes through the center of the cavity 63 and that is perpendicular to the axis of the cavity 63. FIG. 14B shows the $TE_{011}$ mode electromagnetic field on a sectional plane that passes through the axis of the cavity 63. In FIGS. 14A and 14B, arrowed solid lines indicate the electric field inside the cavity 63, and arrowed broken lines indicate the magnetic field inside the cavity 63 (it should however be noted that a $TE_{011}$ mode electric field has no z-axis component and thus FIG. 14B shows no arrowed solid lines indicating it).

In the power combiner 60, the circumferential face of the metal casing 62 has a hole formed in it through which a transmission line extending from the loop antenna ATc is led out of the metal casing 62. The transmission line led out through the hole is the output coaxial waveguide 70. The output coaxial waveguide 70 does not necessarily have to be provided at the circumferential face of the metal casing 62; the output coaxial waveguide 70 may instead be provided, for example, at the bottom face of the metal casing 62.

The magnetic field inside the cavity 63 links with the loop antenna ATc. Thus, the energy accumulated inside the cavity 63 is, by magnetic field coupling, outputted via the loop antenna ATc across the output coaxial waveguide 70. That is, the output power from the 100 postamplifiers 40 is fed to the power combiner 60, which functions as a cavity resonator, and is combined together inside the cavity 63, so that a high-frequency signal (high-frequency electromagnetic wave) of a frequency $f_{TG}$ that has the combined electric power is outputted across the output coaxial waveguide 70. The output power from the output coaxial waveguide 70 amounts to, ideally (with loss and the like ignored), 100 kW.

The resonance mode of a resonance phenomenon in a cavity resonator divides roughly into the TE mode, which involves no electric field component in the z-axis direction, and the TM mode, which involves no magnetic field component in the z-axis direction. A more specific resonance mode of the TE-mode circular cylindrical cavity resonator is, as well known, represented by $TE_{lmn}$ (where l, m, and n are each an integer of zero or more). Here, $TE_{lmn}$ means that an electric field with a wavelength l times the half-wavelength of the resonance frequency is produced in the orbital direction with respect to the circular cavity resonator, that an electric field with a wavelength m times the half-wavelength of the resonance frequency is produced in the radial direction of the circular cavity resonator, and that an electric field with a wavelength n times the half-wavelength of the resonance frequency is produced in the height direction of the circular cavity resonator.

In this embodiment, the resonance mode of the resonance in the power combiner 60 is set to $TE_{011}$, and the shape of the cavity 63 is set so as to suit $TE_{011}$. Accordingly, an electric field with a wavelength one times the half-wavelength of the resonance frequency is produced in the radial direction of the power combiner 60 (that is, the radial direction of the metal casing 62 or the cavity 63), and in addition an electric field with a wavelength one time the half-wavelength of the resonance frequency is produced in the height direction of the power combiner 60 (that is, the height direction of the metal casing 62 or the cavity 63) (these electric fields are produced inside the cavity 63). The resonance frequency in the power combiner 60 is set at the frequency $f_{TG}$.

If, for the sake of discussion, the cavity 63 in the power combiner 60 only has a cavity with the same shape as the circular column 63a in FIG. 9, resonance in the $TE_{011}$ mode and in the $TM_{111}$ mode occurs at a frequency common to them. Adding the groove-form cavities corresponding to the cylinders 63b and 63c to the cavity with the same shape as the circular column 63a separates the $TE_{011}$ and $TM_{111}$ modes from each other and permits resonance to occur in the $TE_{011}$ mode alone. The reason that adding groove-form cavities achieves such separation is well-known, and thus no detailed description will be given in that connection.

The loss in a high-frequency power combiner itself that is configured as a cavity resonator is expressed by a quality factor under no load, which serves as an index of the loss in the cavity. The quality factor under no load is referred to also as the $Q_0$ value, and is calculated by dividing the energy accumulated inside the cavity by the loss on the cavity wall surface. In a case where the resonance mode used in a high-frequency power combiner is the $TM_{010}$ mode, which is commonly used in conventional configurations, the $Q_0$ value is 10000 or less, and the high-frequency loss determined from it through calculation and experiment is several percent or more of the input high-frequency power. By contrast, in the power combiner 60 using the $TE_{011}$ mode and having the mechanical structure and the electromagnetic field distribution described above, the $Q_0$ value is 100000 or more, and thus the high-frequency loss that it produces is reduced to about one tenth of that in a case where the $TM_{010}$ mode is used. That a cavity resonator using the $TE_{011}$ mode provides a $Q_0$ value of 100000 or more is a well-known fact inferred readily through mathematic calculation, and thus no description as to the reason will be given here.

For example, in a case where an output of 100 kW is desired, if using the $TM_{010}$ mode produces a loss of 3 kW, this is equivalent to three of the postamplifiers 40 operating in vain; by contrast, using the $TE_{011}$ mode as in this embodiment only produces a loss as low as about 0.3 kW, and this is highly advantageous.

A cavity distributor configured as a cavity resonator, even when the $TM_{010}$ resonance mode is used to give it the smallest size, has a cylindrical cavity of which the diameter needs to be one half of the resonance wavelength. By contrast, with the power distributor (reentrant cavity-type high-frequency power distributor) 30 having the mechanical structure and the electromagnetic field distribution described above, it is possible to make the required diameter of the cavity far smaller than that in a conventional configuration using the $TM_{010}$ mode.

For example, in a case where the resonance frequency is 500 MHz, configuring a cavity distributor using the $TM_{010}$ resonance mode requires that its cavity have a diameter of 30 cm; by contrast, using the power distributor (reentrant cavity-type high-frequency power distributor) 30 having the mechanical structure and the electromagnetic field distribution described above permits the cavity 33 to have a diameter one half or less of 30 cm, and also permits the cavity 33 to have a height similar to or smaller than that when the $TM_{010}$ resonance mode is used. This helps achieve size reduction of the apparatus.

For the sake of convenience, the configuration, operation, and other features of the high-frequency power amplifier apparatus 1 described above will be referred to as the basic practical example. More specific configuration examples, application examples, and modified examples, etc. of the high-frequency power amplifier apparatus 1 will be described below by way of a number of practical examples. Unless otherwise stated, or unless inconsistent, the description of the basic practical example applies to the practical examples described below; for any specific description of a practical example that is inconsistent with the basic practical example, that specific description of the practical example prevails. Unless inconsistent, any of the features described in connection with any of the several practical examples described below applies to any other of the practical examples (that is, any two or more of the several practical examples can be combined together).

First Practical Example

Figure 15:
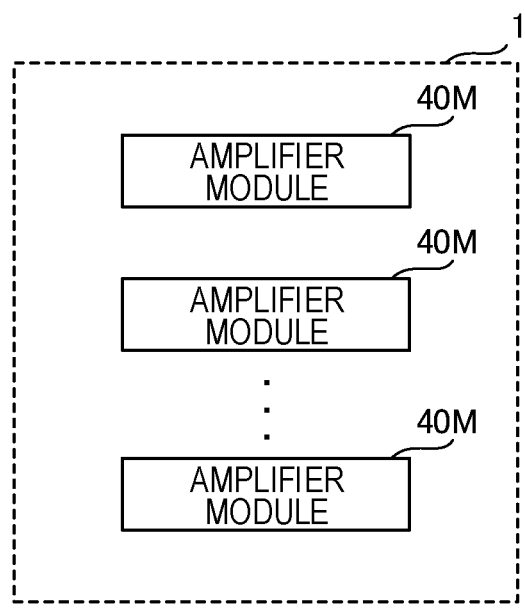
FIG. 15 is a diagram showing a plurality of amplifier modules provided in a high-frequency power amplifier apparatus in a first practical example of the present invention.
Figure 16:
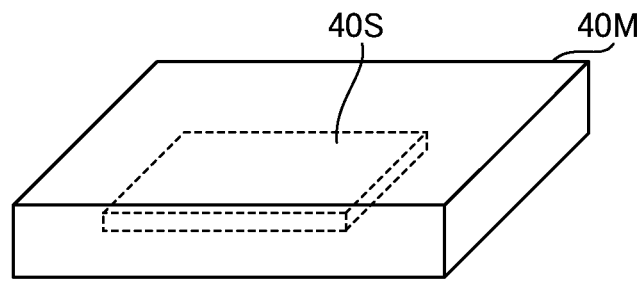
FIG. 16 is a diagram showing a relationship between an amplifier module and an amplifier board in the first practical example of the present invention.

A first practical example will be described. As shown in FIG. 15, the high-frequency power amplifier apparatus 1 includes a plurality of amplifier modules 40M. As shown in FIG. 16, each amplifier module 40M has a casing substantially in a parallelepiped shape, and is formed by accommodating in and fastening to the casing an amplifier board 40S that has mounted circuit elements on it that constitute one postamplifier 40.

It is assumed that one amplifier board 40S is provided for each postamplifier 40, and that one amplifier module 40M is provided for each amplifier board 40S. Accordingly, one postamplifier 40 is mounted on one amplifier board 40S, and one amplifier board 40S is accommodated in and supported on one amplifier module 40M. As described above, when the number of postamplifiers 40 is represented by N, the number of amplifier boards 40S and the number of amplifier modules 40M are each N.

Figure 17:
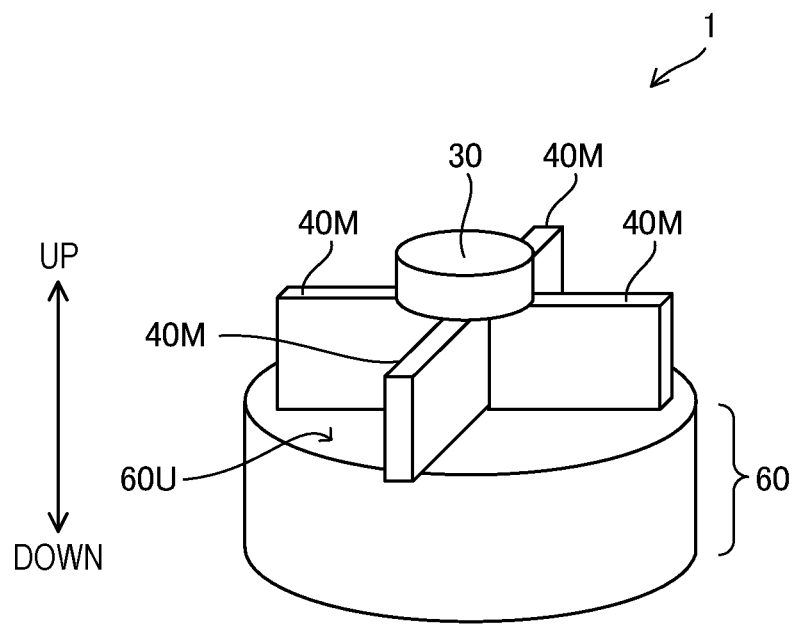
FIG. 17 is a perspective view showing a relative arrangement of the power distributor, the plurality of amplifier modules, and the power combiner in the first practical example of the present invention.

FIG. 17 is a perspective view, showing a relative arrangement, of the power distributor 30, the plurality of amplifier modules 40M, and the power combiner 60. To simplify illustration and avoid complication, in FIG. 17, it is assumed that N=4, and the coaxial lines 50 and the output coaxial waveguide 70 are omitted from illustration.

As shown in FIG. 17, with the axis of the power combiner 60 aligned with the up-down direction, the N amplifier modules 40M are arranged radially on the power combiner 60. Over the N amplifier modules 40M, the power distributor 30 is arranged. The power combiner 60 thus has a function as a base that supports the N amplifier modules 40M and the power distributor 30. Supporting the N amplifier module 40M is equivalent to supporting the N amplifier boards 40S.

The relative arrangement mentioned above will now be described in more detail. The axis of the power combiner 60, which is in a cylindrical shape, and the axis of the power distributor 30, which is in a cylindrical shape, align on the same axis along the up-down direction. The axis of the power combiner 60 is also the axis of the metal casing 62 and the axis of the cavity 63 (see FIG. 8). The axis of the power distributor 30 is also the axis of the inner conductor 31, the axis of the outer conductor 32, and the axis of the cavity 33 (see FIG. 3). The top face of the power combiner 60, which corresponds to the top face of the metal casing 62 of the power combiner 60, is identified by the reference symbol "60U". The top face 60U of the power combiner 60 is in a circular shape.

The N amplifier modules 40M are arranged on the top face 60U of the power combiner 60 in such a manner that the respective casings of the amplifier modules 40M lie in contact with the top face 60U of the power combiner 60. Here, the N amplifier modules 40M are arranged radially with respect to the axis of the power combiner 60. Of the six faces constituting the exterior surface of the casing of each amplifier module 40M, the face that faces away from the face in contact with the top face 60U will be referred to as the top face of the amplifier module 40M; then all the top faces of the N amplifier modules 40M are located on a common plane that is parallel to the horizontal direction. The power distributor 30 is arranged over the amplifier modules 40M in such a manner that the top faces of the amplifier modules 40M lie in contact with the bottom face of the power distributor 30 (in other words, the bottom face of the outer conductor 32).

Figure 18:
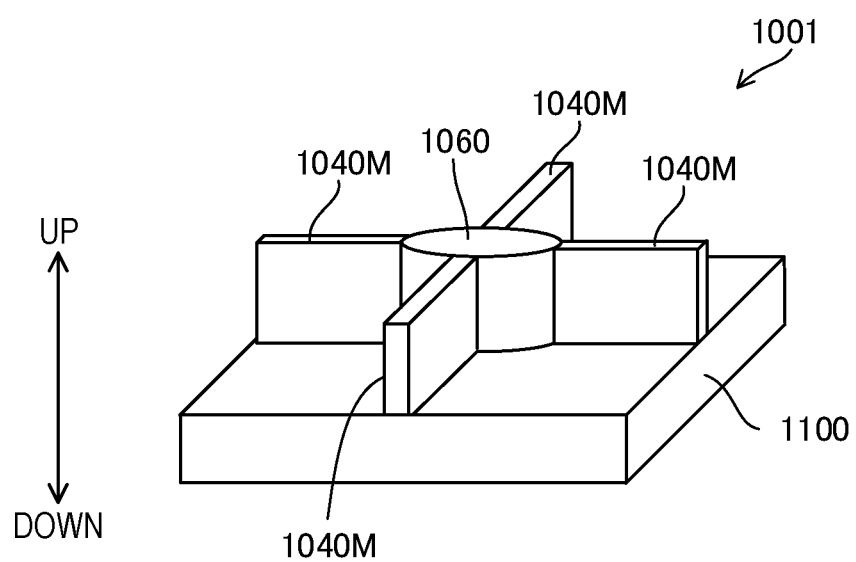
FIG. 18 is a diagram showing an example of arrangement of the components constituting a reference high-frequency power amplifier apparatus.

FIG. 18 shows an example of the arrangement of constituent components in a reference high-frequency power amplifier apparatus 1001, which differs from the high-frequency power amplifier apparatus 1 according to the embodiment Like the high-frequency power amplifier apparatus 1, the reference high-frequency power amplifier apparatus 1001 is a high-frequency power amplifier apparatus that yields an output of the order of 100 kW. In the reference high-frequency power amplifier apparatus 1001, a plurality of amplifier modules 1040M are arranged radially about a cavity-type high-frequency power combiner 1060 that uses the $TM_{010}$ mode, and the high-frequency power of the order of 1 kW from each amplifier module 1040M is combined together by the cavity-type high-frequency power combiner 1060. To simplify illustration and avoid complication, as in FIG. 17, only four amplifier modules 1040M are shown in FIG. 18; in practice, providing 100 amplifier modules 1040M permits the cavity-type high-frequency power combiner 1060 to yield a high-frequency power of the order of 100 kW. The amplifier modules 1040M and the cavity-type high-frequency power combiner 1060 have sizes and weights proportionate to their ratings, and necessitates the use of a base 1100 that can support them.

In a high-frequency power amplifier apparatus yielding an output of the order of 100 kW, using an output element capable of an output of 1 kW requires, even on the assumption of no loss, 100 final-stage amplifiers. Given the number of devices used in those 100 final-stage amplifiers and the size of a cavity combiner for a frequency band of several hundred megahertz, the high-frequency power amplifier apparatus yielding an output of the order of 100 kW will require a considerably large installation space. For example, with the current technology, in a case where the power combiner uses a 500 MHz $TM_{010}$-mode cavity, the amplifiers as a whole require an installation area of (2 m×2 m) or more. That is, for power combining of a high-frequency power of 500 MHz, the configuration shown in FIG. 18, which uses a $TM_{010}$-mode cavity, requires an installation area of (2 m×2 m) or more, and in addition separately requires a base 1100.

By contrast, with the high-frequency power amplifier apparatus 1 according to the embodiment, power combining uses a $TE_{011}$-mode cavity, and the power combiner 60 is accordingly large. With this taken into consideration, the power combiner 60 is given a function as a base by being arranged under the final-stage amplifier boards (corresponding to the amplifier boards 40S accommodated in the amplifier modules 40M). This helps reduce the overall installation volume of the high-frequency power amplifier apparatus. Also, there is no longer the need to separately provide a base 1100 like the one shown in FIG. 18.

Second Practical Example

A second practical example will be described. The second practical example is a modified practical example based on the first practical example, and therefore any description of the first practical example applies to the second practical example for any feature of the second practical example that is not specifically described.

Figure 19:
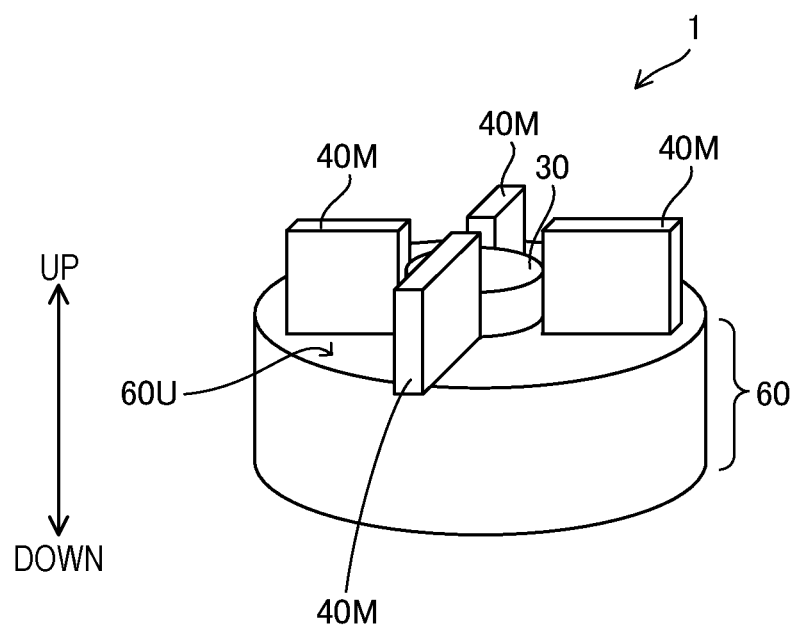
FIG. 19 is a perspective view showing a relative arrangement of the power distributor, the plurality of amplifier modules, and the power combiner in connection with a second practical example of the present invention.

In the arrangement discussed in connection with the first practical example, the power distributor 30 is arranged over the amplifier modules 40. Instead, as shown in FIG. 19, the power distributor 30 may be arranged at the radial center in an arrangement where the N amplifier modules 40M are arranged radially with respect to the axis of the power combiner 60. FIG. 19 is a perspective view, showing the relative arrangement, of the power distributor 30, the plurality of amplifier modules 40M, and the power combiner 60 in the second practical example.

The power distributor 30 is arranged on the top face 60U of the power combiner 60 in such a way that the bottom face of the power distributor 30 (in other words, the bottom face of the outer conductor 32) lies in contact with the top face 60U of the power combiner 60. As in the first practical example, the N amplifier module 40M are arranged on the top face 60U of the power combiner 60 in such a manner that the respective casings of the amplifier modules 40M lie in contact with the top face 60U of the power combiner 60. Here, the N amplifier modules 40M are arranged radially with respect to the axis of the power combiner 60. However, since the power distributor 30 is arranged at the radial center, the N amplifier modules 40M are arranged radially and around the cylindrical face of the power distributor 30. As in the first practical example, the power combiner 60 has a function as a base that supports the N amplifier modules 40M and the power distributor 30.

Third Practical Example

A third practical example will be described. For the sake of convenience, the high-frequency signal (high-frequency power) of a frequency $f_{TG}$ with a power of the order of 100 kW that results from power combining in the power combiner 60 and that is output across the output coaxial waveguide 70 will be referred to as the target high-frequency signal. The target high-frequency signal may be read as the target high-frequency power. The high-frequency power amplifier apparatus 1 is capable of continuous output operation and pulse output operation.

Figure 20:
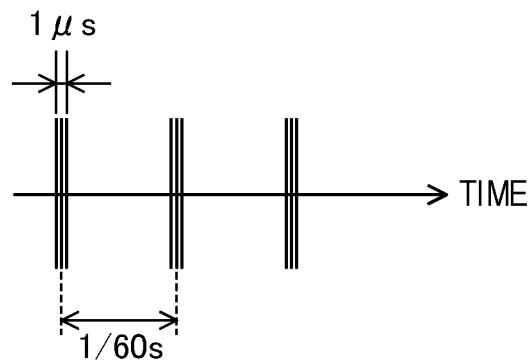
FIG. 20 is a diagram showing pulse output operation in connection with a third practical example of the present invention.

In continuous output operation, the target high-frequency signal is output continuously, without a break, via the output coaxial waveguide 70. In pulse output operation, the target high-frequency signal is output intermittently, as a pulse wave, via the output coaxial waveguide 70. As shown in FIG. 20, in pulse output operation, a target high-frequency signal with a predetermined time width (in the example in FIG. 20, 1 μs) is output repeatedly at a predetermined period $P_{REF}$ (in the example in FIG. 20, 1/60 seconds).

Fourth Practical Example

A fourth practical example will be described. The fourth practical example deals with a method of driving the postamplifiers 40 that is suitable for the pulse output operation mentioned above.

Figure 21:
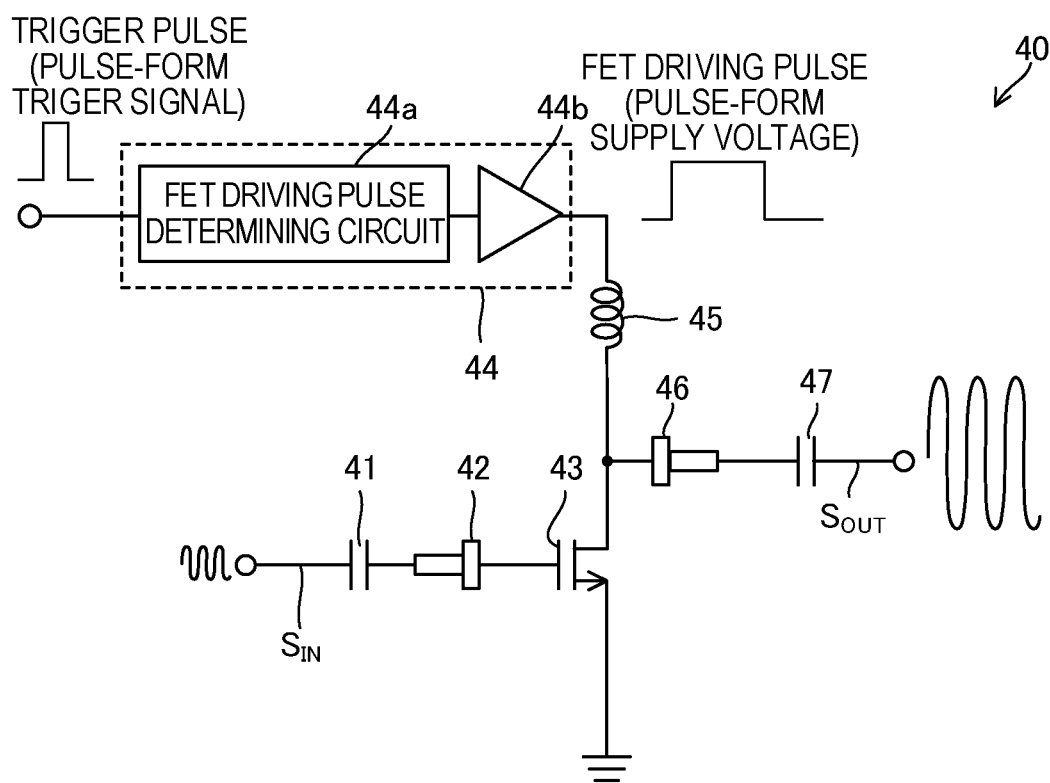
FIG. 21 is a diagram showing a configuration of a postamplifier suitable for pulse output operation in connection with a fourth practical example of the present invention.

FIG. 21 is a diagram showing the configuration of one postamplifier 40, showing a configuration of the postamplifier 40 that is suitable for pulse output operation. The configuration shown in FIG. 21 can be adopted in each of the N postamplifiers 40.

With focus on the single postamplifier 40 shown in FIG. 21, the configuration and operation of a postamplifier 40 according to the fourth practical example will be described. The postamplifier 40 includes a direct-current blocking capacitor 41, an input impedance matching circuit 42, a FET 43 configured as an N-channel field-effect transistor, a circuit 44 supplying the pulse supply voltage (a pulse supply voltage supplying circuit 44), a choke coil 45, an output impedance matching circuit 46, and a direct-current blocking capacitor 47.

The high-frequency signal propagated from a loop antenna ATa inserted in the cavity 33 inside the power distributor 30 is fed, as an input high-frequency signal $S_{IN}$ to the postamplifier 40, to the input terminal of the postamplifier 40, and fed via the direct-current blocking capacitor 41 and the input impedance matching circuit 42 to the gate of the FET 43. The source of the FET 43 is connected to a reference potential point. Though not illustrated in FIG. 21, a circuit for feeding a bias voltage to the gate of the FET 43 can be provided in the postamplifier 40.

The pulse supply voltage supplying circuit 44 is periodically fed with trigger pulses, that is, a pulse-form trigger signal, from an unillustrated trigger pulse supplying circuit. The input period of the trigger pulses equals the period $P_{REF}$ mentioned above. Every time fed with a trigger pulse, the circuit 44 supplying the pulse supply voltage outputs an FET driving pulse. As shown in FIG. 22, FET driving pulses constitute a pulse-form supply voltage that is output in synchronism with the input timing of trigger pulses, and have a pulse width corresponding to a predetermined length of time. The FET driving pulses are fed via the choke coil 45 to the drain of the FET 43. The connection point between the choke coil 45 and the drain of the FET 43 is connected via the output impedance matching circuit 46 and the direct-current blocking capacitor 47 to the output terminal of the postamplifier 40. The signal that appears at the output terminal of the postamplifier 40 is fed, as the output signal $S_{OUT}$ from the postamplifier 40, via the coaxial line 50 to a loop antenna ATb inserted in the cavity 63 inside the power combiner 60.

As described above, every time fed with a trigger pulse, the circuit 44 supplying the pulse supply voltage supplies the serial circuit composed of the choke coil 45 and the FET 43 with a direct-current source voltage for a fixed length of time corresponding to the pulse width of a FET driving pulse. Thus, the period at which trigger pulses are fed to the pulse supply voltage supplying circuit 44 equals the period at which the circuit 44 supplying the pulse supply voltage outputs FET driving pulses. The circuit 44 supplying the pulse supply voltage is composed of a FET driving pulse determining circuit 44a which adjusts and determines the pulse width of FET driving pulses and a pulse power supply 44b which is driven by the circuit 44a to generate and output FET driving pulses with the determined pulse width. Only during the period in which the serial circuit composed of the choke coil 45 and the FET 43 is supplied with the supply voltage, the signal applied to the input terminal of the postamplifier 40 is amplified by the FET 43 so that the amplified signal appears at the output terminal of the postamplifier 40.

As described above, the FET 43 (or the combination of the FET 43 with the choke coil 45) amplifies the input signal $S_{IN}$ by using the supply voltage. When pulse output operation is performed in the high-frequency power amplifier apparatus 1, the combined high-frequency power (in other words, the target high-frequency signal) resulting from power combining in the power combiner 60 is output in pulses repeatedly at the predetermined period $P_{REF}$. During such pulse output operation, the pulse supply voltage supplying circuit 44 is fed with trigger pulses and supplies the FET 43 with FET driving pulses (a pulse-form supply voltage). Since the input period of the trigger pulses equals the predetermined period $P_{REF}$, the FET driving pulses (pulse-form supply voltage) are supplied repeatedly at the predetermined period $P_{REF}$.

In a class-A or class-AB high-frequency amplifier that achieves amplification with linear or quasilinear input-output characteristics, irrespective of whether the high frequency dealt with is a continuous wave or a pulse wave, it is common to supply an amplifier element with a direct-current supply voltage continuously (this method of driving is called a direct-current driving method). However, in a case where pulse output operation is performed in the high-frequency power amplifier apparatus 1, using a direct-current driving method can lead to wastefully high power consumption in the postamplifiers 40 as compared with the average power of the pulse output high frequency from the power combiner 60. For example, in a case where, as shown in FIG. 20, the power combiner 60 yields a pulse output high frequency with a duration of 1 μs at a period of 1/60 seconds, the power consumption in the amplifier elements is wasteful for 0.999999 seconds out of one second, which is inefficient.

As a remedy, in a case where, as in this embodiment, pulse output operation is performed, the amplifier element (in the example in FIG. 21, the FET 43) is pulse-driven by supplying it with FET driving pulses in synchronism with the timing with which the pulse output high frequency is needed (that is, in synchronism with input of trigger pulses) (this method of driving is called a pulse driving method). With this method, during pulse output operation, the average current of the supply power to the postamplifier 40, and hence the power consumption there, can be held notably lower as compared with those observed with a direct-current driving method. For example, in a case as shown in FIG. 20 where the power combiner 60 yields a pulse output high frequency with a duration of 1 μs at a period of 1/60 seconds, it is possible to reduce the power consumption in the postamplifiers 40, in the optimal case, to $(60 \times 10^{-6})$ times that observed with a direct-current driving method. Moreover, even with a pulse driving method as mentioned above, the power and phase of the high-frequency output are generally as stable as with a direct-current driving method.

In an amplifier, the phase and power of the output signal depend on the temperature of the amplifier element. With a direct-current driving method, as shown in FIG. 23A, when a given time elapses after the start-up of the amplifier, the amplifier element reaches thermal equilibrium; once thermal equilibrium is reached, the temperature of the amplifier element remains constant—this is considered to result in a stable output signal. Also with a pulse driving method, since FET driving pulses are supplied at the predetermined period $P_{REF}$, as shown in FIG. 23B, when a given time elapses after the start of pulse output operation, the amplifier element reaches thermal equilibrium; once thermal equilibrium is reached, the temperature of the amplifier element remains constant—this too is thought to result in a stable output signal.

With a pulse driving method, power consumption in the amplifier element occurs at the period of supply of FET driving pulses (that is, period $P_{REF}$), and thus even when thermal equilibrium is reached, in theory, the variation of the temperature of the amplifier element is larger than with a direct-current driving method. In practice, however, the response to the variation of the temperature of the amplifier element is of the order of seconds, and thus, so long as the period $P_{REF}$ is sufficiently small as compared with the response, the stability of the output signal is not affected adversely in practical terms.

The trigger pulse supplying circuit may be a circuit that is provided within the high-frequency power amplifier apparatus 1 but outside the postamplifier 40, or may be a circuit that is provided in a device external to the high-frequency power amplifier apparatus 1. The trigger pulse supplying circuit supplies all of the postamplifiers 40 with common trigger pulses. The trigger pulse supplying circuit may be configured to be provided one in each postamplifier 40. In that case, each trigger pulse supplying circuit can be provided with a timer so that the N trigger pulse supplying circuits in the N postamplifiers 40 generate and output trigger pulses simultaneously.

The high-frequency power amplifier apparatus 1 may be configured to be capable of performing continuous output operation and pulse output operation on a selective basis. When continuous output operation is performed, the pulse power supply 44b can be operated to function as a simple direct-current power supply so that from this direct-current power supply a direct-current supply voltage is supplied continuously to the serial circuit composed of the choke coil 45 and the FET 43.

Fifth Practical Example

A fifth practical example will be described. The fourth practical example dealt with a configuration where a pulse driving method is adopted in the postamplifiers 40. A similar pulse driving method can be adopted also in the preamplifier 10, In that case, the postamplifier 40 in the description of the fourth practical example can be read as the preamplifier 10, and accordingly the input high-frequency signal $S_{IN}$ and the output high-frequency signal $S_{OUT}$ in the description of the fourth practical example are to be understood as, respectively, the high-frequency signal input to the preamplifier 10 and the high-frequency signal output from the preamplifier 10.

While the preamplifier 10 is a single amplifier that yields an output of the order of 20 W, the group of postamplifiers 40 is a group of amplifiers that yields an output of the order of 100 kW in total. Thus, as compared with adopting a pulse driving method in the former, adopting a pulse driving method in the latter offers far greater advantage. Accordingly, when pulse output operation is performed, it is preferable to adopt a pulse driving method at least in the postamplifiers 40.

Sixth Practical Example

A sixth practical example will be described.

Two or more postamplifiers 40 may be mounted on one amplifier board 40S. In that case, the total number of amplifier boards 40S and the total number of amplifier modules 40M are smaller than the total number of postamplifiers 40.

Each postamplifier 40 may be composed of a plurality of stages of amplifiers. Specifically, for example, in a case where each postamplifier 40 is composed of two stages of amplifiers, the postamplifier 40 may include a first amplifier which amplifies and outputs the high-frequency signal fed from a loop antenna ATa and a second amplifier which further amplifies and outputs the amplified high-frequency signal output from the first amplifier. In that case, the high-frequency signal output from the second amplifier is fed to the corresponding loop antenna ATb. Likewise, the preamplifier 10 may be composed of a plurality of stages of amplifiers.

The cavity 63 in the power combiner 60 is not limited to a cylindrical cavity as described above, and may instead be, for example, a squared (angled or cornered) cavity. The same applies to the cavity 33 in the power distributor 30.

It should however be noted that making the cavity 63 a cylindrical cavity maximizes the $Q_0$ value and minimizes the size; thus it is preferable to make the cavity 63 a cylindrical cavity. The same applies to the cavity 33 in the power distributor 30.

Overview of the Invention

To follow is an overview of the present invention.

According to one aspect of the present invention, a high-frequency power amplifier apparatus $W_1$ includes: a plurality of amplifiers (for example, a plurality of postamplifiers 40) that respectively amplify a plurality of distributed signals (for example, a plurality of high-frequency signals fed via a plurality of loop antennas ATa) obtained by distributing a high-frequency signal of a predetermined frequency (for example, an output signal from a preamplifier 10), the amplifiers respectively outputting a plurality of amplified signals; and a cavity-type high-frequency power combiner (for example, a power combiner 60) having a cavity (for example, a cavity 63) surrounded by a conductor wall, the cavity-type high-frequency power combiner combining together the power of the plurality of amplified signals in the cavity by operating in the $TE_{011}$ resonance mode with a resonance frequency equal to the predetermined frequency.

By performing power combining in the $TE_{011}$ resonance mode, it is possible to keep the high-frequency loss extremely low.

For example, the high-frequency power amplifier apparatus $W_1$ can further include a plurality of amplifier modules (40M) that each include an amplifier board (40S). In each of the amplifier modules, one or more of the amplifiers can be mounted on the amplifier board. The cavity-type high-frequency power combiner can be used as a base that supports the plurality of amplifier modules. (See the first practical example.)

This eliminates the need to separately provide a base, and thus helps reduce the overall installation volume of the high-frequency power amplifier apparatus.

For another example, in the high-frequency power amplifier apparatus $W_1$, a reentrant cavity-type high-frequency power distributor (30) can be used as a distributor that distributes the high-frequency signal.

This too helps achieve size reduction of the high-frequency power amplifier apparatus.

More specifically, for example, in the high-frequency power amplifier apparatus $W_1$, the reentrant cavity-type high-frequency power distributor (30) can include: a hollow outer conductor (32) having a distribution cavity (33) formed inside; and a bar-form inner conductor (31) arranged inside the distribution cavity. Part of the core lead (21) of a coaxial line across which the high-frequency signal is propagated can be inserted in the distribution cavity via an opening (35) provided in the outer conductor. One end of the inner conductor can be located opposite one end (21b) of the core lead of the coaxial line, and the other end of the inner conductor can be short-circuited to the outer conductor.

For another example, in the high-frequency power amplifier apparatus $W_1$, the amplifiers can each include an amplifier element (in the example in FIG. 21, an FET 43) that amplifies the distributed signal fed thereto by using a supply voltage. The high-frequency power amplifier apparatus $W_1$ can be configured to perform pulse output operation in which the combined high-frequency power resulting from power combining by the cavity-type high-frequency power combiner is output in pulses repeatedly at a predetermined period. When the pulse output operation is performed, in each of the amplifiers, the amplifier element can supplied with, as the supply voltage, a supply voltage in pulses at the predetermined period.

This helps keep the loss in each amplifier low during pulse output operation.

The embodiments of the present invention allow for many modifications made as necessary within the scope of the technical concept set forth in the appended claims. The embodiments described above are merely examples of how the present invention can be implemented, and the senses of the terms used to define the present invention and its features are not limited to those in which they are used in the description of the embodiments given above. All specific values mentioned in the above description are merely examples, and can naturally be altered to different values.

LIST OF REFERENCE SIGNS 1 high-frequency power amplifier apparatus
10 preamplifier
20 electric-field coaxial coupler
30 power distributor (reentrant cavity-type high-frequency power distributor)
31 inner conductor
32 outer conductor
33 cavity (distribution cavity)
40 postamplifier
40S amplifier board
40M amplifier module
50 coaxial line
60 power combiner ($TE_{011}$-mode cavity-type high-frequency power combiner)
70 output coaxial waveguide
ATa, ATb, ATc loop antenna

The invention claimed is:

1. A high-frequency power amplifier apparatus comprising:
   a plurality of amplifiers that respectively amplify a plurality of distributed signals obtained by distributing a high-frequency signal of a predetermined frequency, the amplifiers respectively outputting a plurality of amplified signals; and
   a cavity-type high-frequency power combiner having a cavity surrounded by a conductor wall, the cavity-type high-frequency power combiner combining together power of the plurality of amplified signals in the cavity by operating in a $TE_{011}$ resonance mode with a resonance frequency equal to the predetermined frequency, wherein
   a reentrant cavity-type high-frequency power distributor is used as a distributor that distributes the high-frequency signal,
   the reentrant cavity-type high-frequency power distributor includes:

a hollow outer conductor having a distribution cavity formed inside; and a bar-form inner conductor arranged inside the distribution cavity, part of a core lead of a coaxial line across which the high-frequency signal is propagated is inserted in the distribution cavity via an opening provided in the outer conductor, and one end of the inner conductor is located opposite one end of the core lead of the core lead of the coaxial line and another end of the inner conductor is short-circuited to the outer conductor.

2. A high-frequency power amplifier apparatus comprising:

a plurality of amplifiers that respectively amplify a plurality of distributed signals obtained by distributing a high-frequency signal of a predetermined frequency, the amplifiers respectively outputting a plurality of amplified signals; and a cavity-type high-frequency power combiner having a cavity surrounded by a conductor wall, the cavity-type high-frequency power combiner combining together power of the plurality of amplified signals in the cavity by operating in a $TE_{011}$ resonance mode with a resonance frequency equal to the predetermined frequency, wherein the amplifiers each include an amplifier element that amplifies the distributed signal fed thereto by using a supply voltage, the high-frequency power amplifier apparatus is operable to perform pulse output operation in which combined high-frequency power resulting from power combining by the cavity-type high-frequency power combiner is output in pulses repeatedly at a predetermined period, when the pulse output operation is performed, in each of the amplifiers, the amplifier element is supplied with, as the supply voltage, a supply voltage in pulses at the predetermined period.

* * * * *